United States Patent
Hammons, Jr.

(10) Patent No.: US 7,296,212 B1
(45) Date of Patent: Nov. 13, 2007

(54) MULTI-DIMENSIONAL IRREGULAR ARRAY CODES AND METHODS FOR FORWARD ERROR CORRECTION, AND APPARATUSES AND SYSTEMS EMPLOYING SUCH CODES AND METHODS

(75) Inventor: A. Roger Hammons, Jr., North Potomac, MD (US)

(73) Assignee: Broadwing Corporation, Austin, TX (US)

( * ) Notice: Subject to any disclaimer, the term of this patent is extended or adjusted under 35 U.S.C. 154(b) by 550 days.

(21) Appl. No.: 10/714,416

(22) Filed: Nov. 14, 2003

Related U.S. Application Data

(60) Provisional application No. 60/426,777, filed on Nov. 15, 2002.

(51) Int. Cl.
*H03M 13/00* (2006.01)
(52) U.S. Cl. ............... 714/781; 714/701; 714/703
(58) Field of Classification Search ........ 714/701, 714/703
See application file for complete search history.

(56) References Cited

U.S. PATENT DOCUMENTS

| | | | | |
|---|---|---|---|---|
| 6,052,815 | A * | 4/2000 | Zook ............... | 714/758 |
| 6,065,147 | A * | 5/2000 | Pyndiah et al. ....... | 714/755 |
| 6,122,763 | A * | 9/2000 | Pyndiah et al. ....... | 714/755 |
| 6,763,494 | B2 * | 7/2004 | Hewitt ............. | 714/780 |
| 2001/0050622 | A1 * | 12/2001 | Hewitt et al. ........ | 341/50 |
| 2002/0188909 | A1 * | 12/2002 | Chen .............. | 714/785 |
| 2003/0171934 | A1 * | 9/2003 | Zhang et al. ........ | 704/500 |

OTHER PUBLICATIONS

Picart et al. Performance of Turbo-decoded product codes used in multilevel coding. 1996 IEEE international conference on converging technologies for tomorrow. pp. (107-111) vol. 1.*
Burton, H.O., et al., Cyclic Product Codes, Jul. 1965, pp. 433-439, IEEE Transactions on Information Technology.
Forney, Jr., G.D., Generalized Minimum Distance Decoding, Apr. 1966, pp. 125-131, IEEE Transactions on Information Theory, vol. IT-12, No. 2.
Reddy, S.M., On Decoding Iterated Codes, Sep. 1970, pp. 624-627, IEEE Transactions on Information Theory, vol. IT-16, No. 5.
Wainberg, S., Error-Erasure Decoding of Product Codes (Correspondence), Nov. 1972, pp. 821-823, IEEE Transactions on Information Theory.
Chien, R.T., et al., Dual Product Codes for Correction of Multiple Low-Density Burst Errors, Sep. 1973, pp. 672-677, IEEE Transactions on Information Theory, vol. IT-19, No. 5.
Kasahara. M., et al., New Classes of Binary Codes Constructed on the Basis of Concatenated Codes and Product Codes, Jul. 1976, pp. 462-468, IEEE Transactions on Information Theory, vol. IT-22, No. 4.

(Continued)

*Primary Examiner*—Guy Lamarre
*Assistant Examiner*—Sam Rizk

(57) ABSTRACT

Methods, apparatuses, and systems for encoding information symbols comprising loading information symbols into a data array with $n^{(1)}$ rows and $n^{(2)}$ columns, wherein each column has $k_i^{(1)}$ information symbols, and wherein $k^{(1)}$ is an array that has at least two different values, encoding each column with a code $C_i^{(1)}$ from a family of nested codes $C^{(1)}$, wherein $C^{(1)}$ includes two different nested codes, and encoding each row with a code $C^{(2)}$.

19 Claims, 4 Drawing Sheets

OTHER PUBLICATIONS

Wolf, J.K., Efficient Maximum Likelihood Decoding of Linear Block Codes Using a Trellis, Jan. 1978, pp. 76-80, IEEE Transactions on Information Theory, vol. IT-24, No. 1.

Cooper, III, A.B., et al., Iterated Codes With Improved Performance (Correspondence), Jan. 1978, pp. 116-118, IEEE Transactions on Information Theory, vol. IT-24, No. 1.

Helleseth, T., et al., The Weight Hierarchies of Some Product Codes, May 1996, pp. 1029-1034, IEEE Transactions on Information Theory, vol. 42, No. 3.

Yi, C., et al., Interleaving and Decoding Scheme for a Product Code for a Mobile Data Communication, Feb. 1997, pp. 144-147, IEEE Transactions on Communications, vol. 45, No. 2.

Kamiya, N., On Acceptance Criterion for Efficient Successive Errors-and-Erasures Decoding of Reed-Solomon and BCH Codes, Sep. 1997, pp. 1477-1488, IEEE Transactions on Information Theory, vol. 43, No. 5.

Baggen, C.P.M.J., et al., On Diamond Codes, Sep. 1997, pp. 1400-1411, IEEE Transactions on Information Theory, vol. 43, No. 5.

Pyndiah, R.M., Near-Optimum Decoding of Product Codes: Block Turbo Codes, Aug. 1998, pp. 1003-1010, IEEE Transactions on Communications, vol. 46, No. 8.

Haslach, C., et al., A Decoding Algorithm With Restrictions for Array Codes, Nov. 1999, pp. 2339-2344, IEEE Transactions on Information Theory, vol. 45, No. 7.

Dave, S., et al., An Efficient Decoding Algorithm for Block Turbo Codes, Jan. 2001, pp. 41-46, IEEE Transactions on Communications, vol. 49, No. 1.

\* cited by examiner

MULTI-DIMENSIONAL IRREGULAR ARRAY CODES AND METHODS FOR FORWARD ERROR CORRECTION, AND APPARATUSES AND SYSTEMS EMPLOYING SUCH CODES AND METHODS

CROSS-REFERENCE TO RELATED APPLICATIONS

This application claims priority from U.S. Provisional Patent Application No. 60/426,777, filed Nov. 15, 2002, and which is incorporated herein by reference.

STATEMENT REGARDING FEDERALLY SPONSORED RESEARCH OR DEVELOPMENT

Not Applicable.

BACKGROUND OF THE INVENTION

The present invention is directed generally to the transmission of signals in communications systems. More particularly, the invention relates to systems, devices, and methods for producing, transmitting, receiving, and decoding forward error corrected signals using multi-dimensional irregular array codes and using the codes to correct errors in signal.

The development of digital technology provided the ability to store and process vast amounts of information. While this development greatly increased information processing capabilities, it was soon recognized that in order to make effective use of information resources it was necessary to interconnect and allow communication between information resources. Efficient access to information resources requires the continued development of information transmission systems to facilitate the sharing of information between resources.

One way to more efficiently transmit large amounts of information is through forward error correction (FEC) coding. FEC coding can result in a processing gain that allows for lower signal power and/or higher data rates while achieving a required data error rate. FEC coding is the addition of redundancy to transmitted data to provide the ability to detect and correct errors that occur during data transmission.

FIG. 1 shows the structure of FEC encoded data using a "product code." A product code may be derived from component codes by arranging the information to be encoded into a two-dimensional array. A component code is assigned to each dimension and applied to all vectors in the assigned dimension. The component codes can be different or the same for each dimension. The encoded information results in an $n_1 \times n_2$ array. Information symbols are loaded into a $k_1 \times k_2$ portion of the $n_1 \times n_2$ array. For example, $C_1$ and $C_2$ are linear block codes with parameters $[n_1, k_1, d_1]$ and $[n_2, k_2, d_2]$ respectively. The information symbols to be encoded by $C_1$ and $C_2$ in this example may be binary data. The first parameter n denotes the code word length or number of coded bits. The second parameter k denotes the dimension of the code and corresponds to the number of information bits to be encoded. The third parameter d denotes the minimum Hamming distance of the code or the minimum number of positions in which two distinct code words must differ. Generally, r=n−k check symbols result from encoding the k information symbols. The two-dimensional product code $C_1 C_2$ is formed by applying $C_1$ to each of the columns and $C_2$ to each of the rows of the $k_1 \times k_2$ rectangular array of information bits as depicted in FIG. 1. Thus, the each code word in $C_1 C_2$ can be represented as an $n_1 \times n_2$ matrix, whose columns are code words in $C_1$ and whose rows are code words in $C_2$. The product code has parameters $[n_1 n_2, k_1 k_2, d_1 d_2]$. Alternatively, $C_2$ may first be applied to the rows and then $C_1$ to the columns. The order that codes are applied does not matter. In either case the check on checks will be the same because the codes are linear block codes.

Product codes may be decoded in an iterative fashion using decoders corresponding to the component codes. For example, in a two-dimensional product code, one could first apply a hard-decision decoder for $C_1$ to the columns, and then apply a hard-decision decoder for $C_2$ to the rows as corrected by the column-decoding pass. Often, error patterns that were uncorrectable in a given row during the first row-decoding pass become correctable after the column-decoding pass has corrected some errors. Thus, iterating between row-decoding and column-decoding may correct more errors than a single decoding pass. A fixed number of iterations may be performed. Alternatively, iterations may be preformed until some stopping criterion is satisfied, for example, performing iterative decoding until the decoded array passes a cyclic redundancy check. Also, product codes may be decoded using turbo decoding techniques that provide an efficient method of exchanging soft-decision information among component decoders. For more information on turbo decoding see: Pyndia, R. M., Near-Optimum Decoding of Product Codes: Block Turbo Codes, *IEEE Tans. on Communications*, Vol. 46, No. 8, August 1998, pp. 1003-1010. Because a code may be decoded using various methods, the names used for codes will refer exclusively to their construction and not to a decoding method.

Bose-Chaudhuri-Hocquenghem (BCH) codes are frequently used in the construction of product codes because the class offers a wide choice of block sizes and rates while resulting in efficient decoders. Reed-Solomon codes are non-binary cyclic codes constructed in the analogous fashion over the Galois field GF($2^r$) and are similarly well-suited for non-binary product code constructions. BCH and Reed-Solomon codes are briefly described below.

A BCH code of natural length $n=2^r-1$ is a binary cyclic code in which the generator polynomial g(x) has binary coefficients and has the elements $\alpha^b, \alpha^{b+1}, \ldots, \alpha^{b+d-2}$ in the finite field GF($2^r$) as roots. Here b and d are design parameters, and $\alpha$ is a primitive in GF($2^r$). The generator polynomial for this code is:

$$g(x)=LCM(M_b(x),M_{b+1}(x), \ldots ,M_{b+d-2}(x)). \quad (1)$$

$M_i(x)$ denotes the minimal polynomial for the element $\alpha^i$. This class of BCH codes is referred to as the class of primitive BCH codes. If b=1, the codes are further classified as narrowsense primitive BCH codes. More generally, we can let $\alpha$ be a non-primitive element in GF($2^r$) of multiplicative order ord $\alpha$. In this case, the BCH codes so constructed have natural length n=ord $\alpha$ and are referred to as non-primitive BCH codes. In all cases, the minimum Hamming distance of the BCH code is at least as large as the design parameter d. The maximum guaranteed error correction capability of the code is therefore at least t=[(d−1)/2]. The dimension of the code is k=n−deg g(x).

Reed-Solomon codes are non-binary cyclic codes constructed in the analogous fashion over the Galois field GF($2^r$) and are similarly well-suited for non-binary product code constructions. The non-binary generator polynomial $$g(x)=(x+\alpha^b)(x+\alpha^{b+1}) \ldots (x+\alpha^{b+d-2}) \quad (2)$$

generates a non-binary Reed-Solomon code of length n=ord α and minimum Hamming distance of exactly d. Usually, α is taken to be primitive so that $n=2^r-1$. The dimension of the code is k=n−deg g(x)=n−d+1.

A cyclic code of length n consists of all polynomials of degree <n that are proper multiples of the generator polynomial g(x). Thus, cyclic codes are nested in the following sense. Let $C_1, C_2, \ldots, C_L$ be a family of cyclic codes in which code $C_i$ has generator polynomial $g_i(x)$. Then all of the codes $C_i$ are contained in the cyclic code $C_{sup}$ as subcodes, where $C_{sup}$ has generator polynomial:

$$g(x)=GCD(g_1(x),g_2(x),\ldots,g_L(x)). \quad (3)$$

GCD refers to the greatest common divisor. For example, among the narrowsense primitive BCH codes, the code with maximum error-correcting capability t=1 contains the code with maximum error-correcting capability t=2, which contains the code with maximum error-correcting capability t=3, and so forth. This nesting property of the BCH (and Reed-Solomon codes) plays no significant role in product code constructions, but nesting is a useful feature in the irregular array code construction of the present invention.

One problem with product codes is that they do not have a "thin spectrum" in the sense that the number of code words of minimum Hamming weight $d_{min}$, weight $d_{min}+1$, etc. are small. Product codes do not have a thin spectrum. For example, the product code generated by the single parity check code. The single parity check code has $d_{min}=2$, so the product code has $d_{min}=4$. All patterns of the following form are code words of weight 4:

$$C(M,N)=C(M,N+n)=C(M+m,N)=C(M+n,N+n)=1,$$

$$C(i,j)=0 \text{ for all other } i,j.$$

In fact, any translation or expansion of a valid pattern of 1s (i.e. valid meaning that the result is a codeword) is also a valid pattern. This is due to the regularity of the product code.

Assuming the optimal decoder, the asymptotic high signal to noise ratio performance of a code in an additive white Guassian noise like channel is governed by the minimum Hamming weight and number of code words of minimum Hamming weight. At low SNR, the entire weight spectrum is important, so spectral thinness results in better performance for SNRs near the Shannon limit. Therefore there remains a need for FEC codes that improve performance at lower SNRs found in many applications.

BRIEF SUMMARY OF THE INVENTION

The present invention is generally directed to multi-dimensional irregular array codes and methods for error correction, and apparatuses and systems employing such codes and methods. The present invention may be embodied in many forms, such as computer software and firmware, communications systems and apparatuses, storage apparatuses and systems, and many other applications.

One embodiment of the present invention is a method for encoding information symbols comprising loading information symbols into a data array with $n^{(1)}$ rows and $n^{(2)}$ columns, wherein each column has $k_i^{(1)}$ information symbols, and wherein $k^{(1)}$ is an array that has at least two different values, encoding each column with a code $C_i^{(1)}$ from a family of nested codes $C^{(1)}$, wherein $C^{(1)}$ includes two different nested codes, and encoding each row with a code $C^{(2)}$.

Another embodiment of the present invention is a method for encoding data comprising: loading information symbols into an m-dimensional array, wherein m is a positive integer $\geq 2$, and wherein a first dimension has a vector of $k_i^{(1)}$ information symbols, where $k^{(1)}$ is an array that has at least two different values, and a second dimension has a vector of fixed number $k^{(2)}$ information symbols, encoding each vector of the first dimension with a code $C_i^{(1)}$ from a family of nested codes $C^{(1)}$, wherein $C^{(1)}$ includes two different nested codes, and encoding each vector of the second dimension with a code $C^{(2)}$.

The present invention can be embodied in computer executable code such as, for example, information stored in a data storage medium which, when executed by a processor, cause the processor to perform the steps of: loading information symbols into a data array with $n^{(1)}$ rows and $n^{(2)}$ columns, wherein each column has $k_i^{(1)}$ information symbols, and wherein $k^{(1)}$ is an array that has at least two different values, encoding each column with a code $C_i^{(1)}$ from a family of nested codes $C^{(1)}$, wherein $C^{(1)}$ includes two different nested codes, and encoding each row with a code $C^{(2)}$.

Another embodiment of the present invention is an irregular array code for encoding information symbols in a data array having rows and columns comprising a first code family $C_1$ including nested codes $C_i^{(1)}$, wherein nested codes $C_i^{(1)}$ encode the columns of the data array, and wherein the first code family $C_1$ includes at least two different nested codes, and a second code family $C_2$ including a single code $C^{(2)}$, wherein code $C^{(2)}$ encodes the rows of the data array.

Another embodiment of the present invention is an information encoder comprising a first input for receiving information symbols, a second input for receiving an irregular array code, a processor coupled to the first and second inputs that places the information symbols in a data array and that applies the irregular array code to produce encoded information symbols, and an output for outputting the encoded information symbols, wherein the irregular array code includes a first code family $C_1$ including nested codes $C_i^{(1)}$, wherein nested codes $C_i^{(1)}$ encode the columns of the data array, and wherein the first code family $C_1$ includes at least two different nested codes and a second code family $C_2$ including a single code $C^{(2)}$, wherein code $C^{(2)}$ encodes the rows of the data array.

Another embodiment of the present invention is a communication system comprising: a forward error correction encoder with an input receiving information symbols and an output producing encoded data, wherein the forward error correction encoder loads information symbols into an array with $n^{(1)}$ rows and $n^{(2)}$ columns, wherein each column has $k_i^{(1)}$ information symbols, and wherein $k^{(1)}$ is an array that has at least two different values, encodes each column with a code $C_i^{(1)}$ from a family of nested codes $C^{(1)}$, wherein $C^{(1)}$ includes two different nested codes, and encodes each row with a code $C^{(2)}$. In that embodiment, the system also includes a communication medium, a transmitter with an input connected to the output of the forward error correction encoder and an output connected to the communication medium, wherein the transmitter transmits the encoded data through the communication medium, a receiver with an input connected to the communication medium and an output, wherein the receiver receives the encoded data from the communication medium, and a forward error correction decoder with an input connected to the output of the receiver, wherein the decoder decodes the encoded data into information symbols.

Those and other embodiments of the present invention will be described in the following figures and detailed description of the invention.

BRIEF DESCRIPTION OF THE DRAWINGS

Embodiments of the present invention will now be described, by way of example only, with reference to the accompanying drawings, wherein.

DETAILED DESCRIPTION OF THE INVENTION

Figure 1:
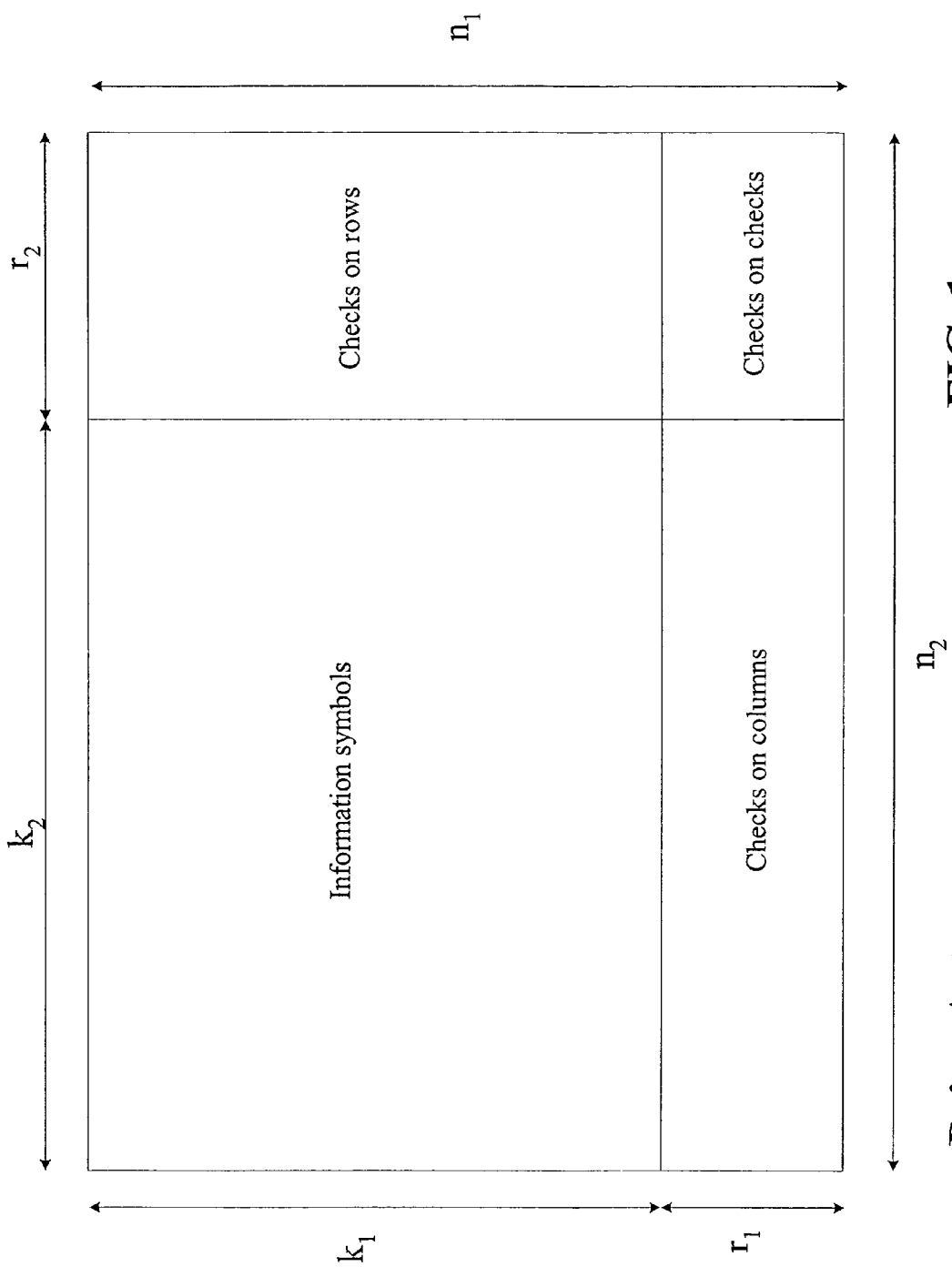
FIG. 1 shows the arrangement of a prior art two-dimensional product code.
Figure 2:
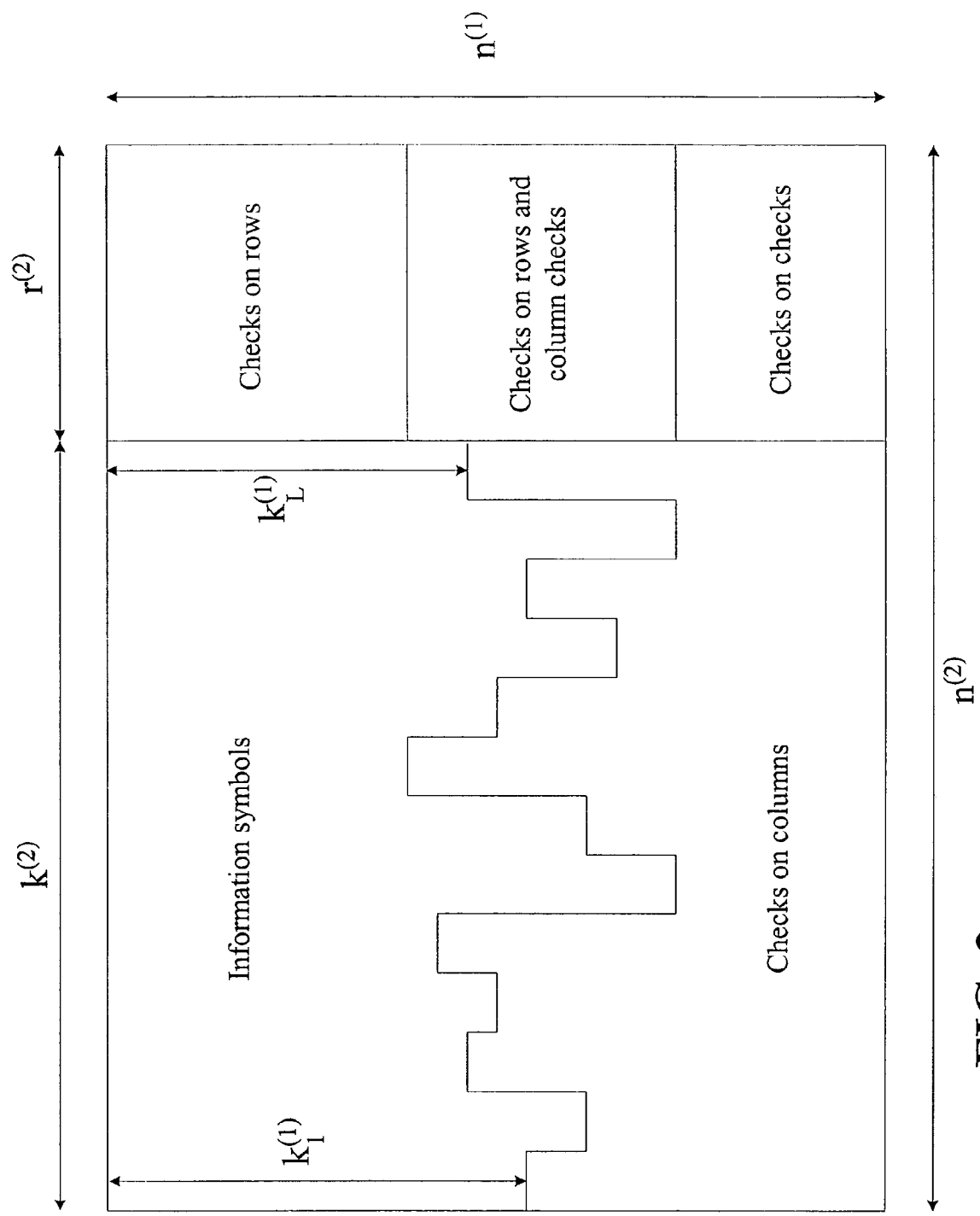
FIG. 2 shows the arrangement of a two-dimensional irregular array code according to the present invention.

FIG. 2 shows the structure of FEC encoded data using an irregular array code and having an information array size $n^{(1)} \times n^{(2)}$. Irregular array codes are multi-dimensional codes similar in construction to product codes. Irregular array codes use at least two nested codes of different lengths to encode the information symbols in one dimension resulting in an irregular structure in that dimension. Allowing an irregular structure in one of the dimensions of the array code results in a code with thinner spectrum or a smaller number of code words with a Hamming distance of $d_{min}$. Therefore, irregularity provides a mechanism for producing codes that have a thinner weight spectrum resulting in improved performance at lower SNRs found in many applications.

The information array includes information symbols and check symbols. Typically, the information symbols are placed in columns starting at the top. When a column is full, information symbols are then placed in the next column moving left to right. A total number of $k^{(2)}$ columns are filled with information symbols. The number of information symbols placed in each column is $k_i^{(1)}$, where i specifies the column, and i has values $1, \ldots, k^{(2)}$. As shown in FIG. 2 by the different length information columns, the $k_i^{(1)}$ take on at least two different values, which introduces irregularity into the code. The total number of information symbols placed in the data array is $$K = \sum_{i=1}^{k^{(2)}} k_i^{(1)}.$$

Next, linear block codes are used to encode the information symbols. Let $C_m = [C_1^{(m)}, C_2^{(m)}, \ldots, C_{L_m}^{(m)}]$ denote an ordered $L_m$-tuple of binary or non-binary linear block codes whose $i^{th}$ member $C_i^{(m)}$ has parameters $[n_i^{(m)}, k_i^{(m)}, d_i^{(m)}]$ where m denotes the dimension to which the codes will apply. Note that the codes in $C_m$ share a common codeword length $n_i^{(m)}$, but may have differing rates (i.e. the ratio of information symbols to total symbols) and error correction capability as indicated by the other two parameters. It is possible that some or all of the member codes are the same. Let $C_{sup}^{(m)}$ denote the smallest linear block code having all members of $C_m$ as subcodes. According to FIG. 2, $C_2 = [C^{(2)}]$ denotes a code family of size $L_2=1$ whose sole member $C^{(2)}$ has parameters $[n^{(2)}, k^{(2)}, d^{(2)}]$. Also, $C_1 = [C_1^{(1)}, C_2^{(1)}, \ldots, C_{L_1}^{(1)}]$ denotes a family of size $L_1 = k^{(2)}$ having common code word length $n^{(1)}$. The family $C_1$ should have at least two different codes. Let $\langle C_1, C_2 \rangle$ denote the irregular array code in which $C_1$ is used to encode columns and $C_2$ is used to encode rows. The component codes $C_i^{(1)}$ encode each column i. Next, component code $C^{(2)}$ encodes each row.

The last $r^{(2)}$ columns of the resulting code matrix are code words in $C_{sup}^{(1)}$ because of the restriction that the family $C_2$ be of size 1. $C_1$ should be carefully selected so that $C_{sup}^{(1)}$ admits a suitable decoder; then general array decoding techniques are feasible for irregular array codes. Therefore, iterative decoding techniques, either hard-decision or soft-decision, that have been developed for product codes are readily adapted to the irregular array codes. Adapting the decoding techniques involve using a decoder to decode a vector in the irregular array corresponding to the code applied to the vector and using the decoder for $C_{sup}^{(1)}$ on the last $r^{(2)}$ columns.

It is desirable to choose $C_1$ so that $C_{sup}^{(1)}$ has as large a Hamming distance as possible. $C_{sup}^{(1)}$ has a Hamming distance that is smaller or equal to the smallest Hamming distance of any code $C_i^{(m)}$ in $C_1$. Therefore, depending on the choice of component codes, $C_{sup}^{(1)}$ may be the trivial code consisting of all possible received vectors resulting in a trivial decoder (accepting whatever is received). The performance of such an irregular array code may be poor. With cyclic codes in general—and BCH or Reed-Solomon codes in particular—it is often not difficult to choose $C_1$ so that $C_{sup}^{(1)}$ has as large a Hamming distance as possible.

The class of BCH or Reed-Solomon codes provides a framework in which to construct irregular array codes because:
(1) the class offers a wide choice of block sizes and rates while admitting efficient decoders; and
(2) it is easy to develop nested families of these codes in which the weaker codes contain the stronger codes and subcodes.

The nesting feature is particularly important for irregular array codes because it enables designs in which $C_{sup}^{(1)}$ is a nontrivial BCH or Reed-Solomon code. Indeed, it is often possible to select $C_1$ so that $C_{sup}^{(1)}$ is one of its members—hence the minimum Hamming distance is no less than the designer wishes. For example, $C_1$ may be chosen to be a family of BCH codes having common design parameter b but possibly different values of the design parameter d. Then, equations (1) and (3) show that $C_{sup}^{(1)}$ is the BCH code in $C_1$ having the smallest value of d.

Figures 3, 4:
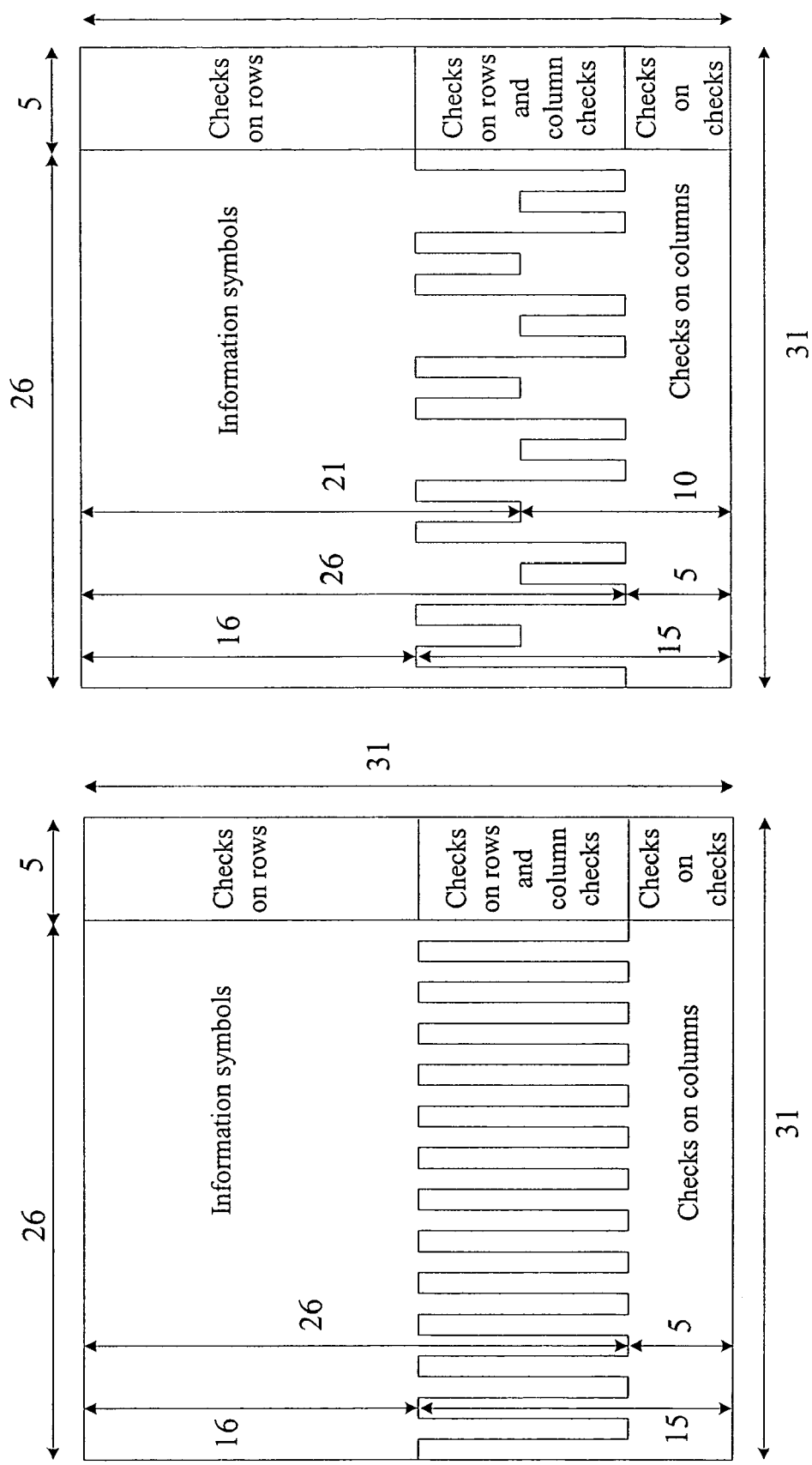
FIGS. 3 and 4 show examples of other irregular array codes according to the present invention.

FIG. 3 shows another example of an irregular array code according to the present invention. This irregular array code uses BCH(31,26) and BCH(31,16) in an alternating fashion to encode the 26 information bearing columns and uses a BCH(31,26) code to encode the rows. This code has a length of 31×31=961 and an information rate of 546/961=0.568.

FIG. 4 shows another example of an irregular array code according to the present invention. This irregular array code uses three column codes BCH(31,26), BCH(31,21), and BCH(31,16) to encode the 26 information bearing columns in the following order: 26, 16, 21; 16, 26, 21; 26, 16, 21; 16, 26, 21; 26, 16, 21; 16, 26, 21; 26, 16, 21; 16, 26; 21; 26, 16. The rows are coded using the row code BCH(31,26). This code has a length of 31×31=961 and an information rate of 546/961=0.568. Many other variations of irregular array codes may also be used with the present invention.

The irregular array codes of FIGS. 3 and 4 were simulated and compared to the performance of a product code over an additive white Guassian noise (AWGN) channel. The simulated product code was the product code BCH(31,21) BCH (31,26). The irregular array codes and product code have the same composite length and code rate. The simulation used an iterative decoding algorithm using conventional hard-decision algebraic decoders for the component BCH codes. The simulation performed a 6-iteration, column-first iterative decoding, followed by an independent 6-iteration, row-first iterative decoding. In a hardware implementation, the two decodings could be done in parallel. If both iterative decodings succeed in decoding the received matrix and agree upon the decoded information bits, then the irregular array code decoder declares a success and outputs the decoded information bits; otherwise, the irregular array code decoder declares a failure and passes the received information bits through uncorrected. For the implemented decoding technique, the irregular array code of FIG. 3 outperforms the product code by 0.4 dB at $10^{-5}$ decoded bit error rate, and the irregular array code of FIG. 4 outperforms the product code by 0.2 dB at $10^{-5}$ decoded bit error rate. Variations in the code parameters and decoding algorithm may result in other coding gains.

FIGS. 3 and 4 show the information symbols in the upper left hand corner and the check symbols along the bottom and right hand side. It is also possible for the information symbols to be placed elsewhere in the array. It is also not required that the information symbols and check symbols be placed contiguously. If desired, the information and check symbols can be intermingled. Also, the irregularity of the information symbols may occur in the rows or any other dimension. The information symbols and check symbols may be placed into the array in any convenient order and should be read out or otherwise processed so as to maintain the proper information order.

Irregular array codes are extendable to higher dimensions in a recursive fashion. For a three-dimensional irregular array code $\langle C_1, C_2, C_3 \rangle$, a third family $C_3$ is selected consisting of a single code $C^{(3)}$ having parameters $[n^{(3)}, k^{(3)}, d^{(3)}]$. As described above, $k^{(3)}$ independent two-dimensional code word arrays of the $\langle C_1, C_2 \rangle$ irregular array code are formed. These two-dimensional code word arrays are arranged together as part of an $n^{(1)} \times n^{(2)} \times n^{(3)}$ cube. The rest of the code cube is then filled by applying the code $C^{(3)}$ along the third dimension.

Similarly, for the four-dimensional irregularly array code $\langle C_1, C_2, C_3, C_4 \rangle$, $k^{(4)}$ independent 3-dimensional code word cubes of the $\langle C_1, C_2, C_3 \rangle$ irregular array code are built. Then the single code $C^{(4)}$ in $C^4$ is applied to the set of $k^{(4)}$—tuples formed by aggregating the values in each of the independent code word cubes at a given position in the cube. The result is a set of $n^{(1)} \times n^{(2)} \times n^{(3)}$ code words of length $n^{(4)}$, which can be thought of as filling an $n^{(1)} \times n^{(2)} \times n^{(3)} \times n^{(4)}$ hypercube. One proceeds similarly for the higher dimensions. As long as the code families introduced for the higher dimensions consist only of a single code, every vector along any of the dimensions of the hyper-array are code words in the component codes associated with that dimension, so iterative array decoding methods still apply. Again, the irregularity may be introduced in any single dimension in higher dimension codes.

There are numerous variations that are possible with regard to the choice of component codes. One can adjust the array dimensions and code rate of the composite code by using well-known techniques such as shortening, puncturing, or extending. Use of coset coding is also possible. These methods can be applied effectively to either the component codes or to the composite code. Because Reed-Solomon codes contain BCH codes as base-field subcodes, it is possible to mix the two families within an irregular array code construction. Also, other classes of codes that provide nested families of codes could be used, for example, Reed-Muller codes.

Figure 5:
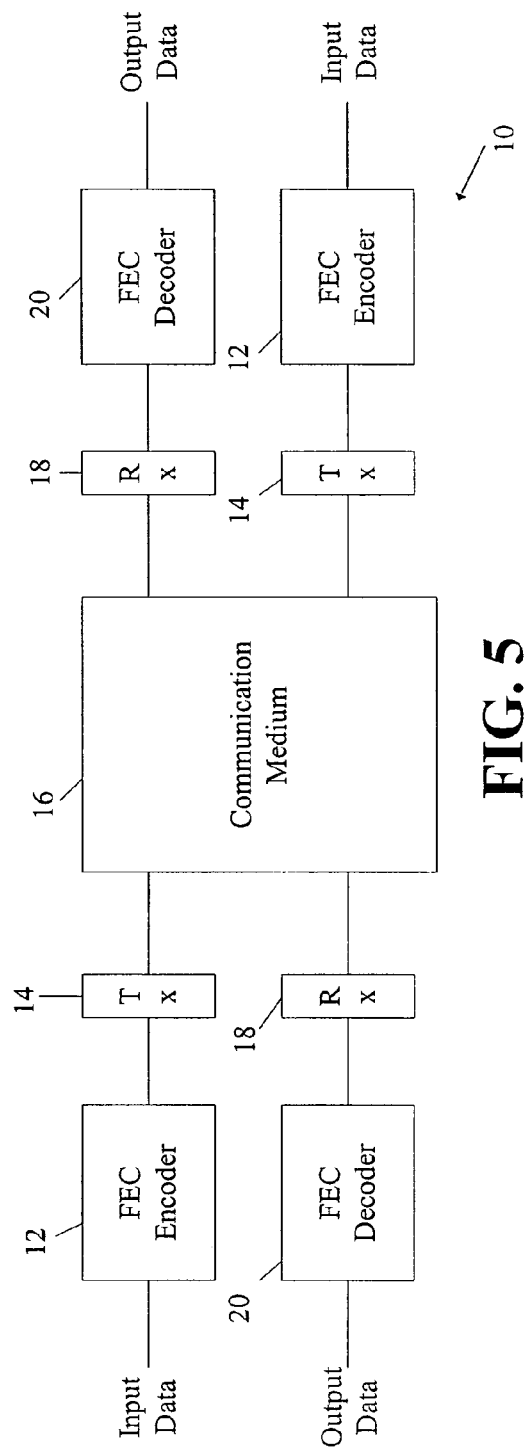
FIGS. 5-6 show a communication system using the present invention.

FIG. 5 illustrates a communication system 10 that uses the present invention. The communication system 10 may realize a processing gain by use of the irregular array code. This processing gain leads to improved system performance. A forward error correction encoder 12 receives input information symbols. The forward error correction encoder 12 encodes the information symbols as described above using the irregular array code and outputs encoded symbols. A transmitter 14 receives the encoded symbols and transmits the encoded symbols through a communication medium 16. A receiver 18 receives the encoded symbols from the communication medium 16 and sends the encoded symbols to a forward error correction decoder 20. The forward error correction decoder 20 decodes the encoded symbols, resulting in output information symbols. FIG. 3 illustrates a bi-directional communication system 10 with two information streams moving in opposite directions. The present invention can also be implemented as a uni-directional communication system in which the communication system 10 communicates in one direction only.

The input information can be any type of information, for example, voice, video, or data. The information may be represented in any modulation format recognized by the forward error correction encoder 12. Typically, the input information symbols are in the form of an electrical signal, but the information symbols can also be in the form of an optical signal. The forward error correction encoder 12 receives the input information symbols and applies an irregular array forward error correction code to the symbols producing encoded symbols as described above.

The transmitter 14 receives the encoded symbols from the forward error correction encoder 12. The transmitter 14 transmits the encoded symbols into communication medium 16. The structure and operation of the transmitter 14 depends largely upon the type of communication medium 16 used. Examples of the communication medium 16 are electrical cables, electrical wires, electrical waveguides, optical fibers, and optical waveguides. It is also possible that free space electrical or optical transmission be used in a free space communication medium 16. The communication medium 16 could also be a storage medium such as, for example, magnetic disks, solid-state memory, or optical disks. For a storage medium, the transmitter would be a write device and the receiver would be a read device. The transmitter 14 can produce narrowband, wideband, or ultra-wideband signals depending upon the nature of the communication medium 16 and the requirements of the communication system 10. The communication medium 16 can actually contain a number of channels that are time division multiplexed, frequency division multiplexed, space division multiplexed, wavelength division multiplexed, or otherwise multiplexed. The transmitter 14 may modulate that data onto a signal using any of a variety of well known modulation techniques and formats.

The receiver 18 receives the signal representing the encoded symbols from the communication medium 16. The receiver 18 demodulates the signal from the communication medium 16 resulting in the same encoded symbols transmitted by the transmitter 12 (except the information symbols may have errors). The forward error correction decoder 20 receives the demodulated encoded symbols from the receiver 18. The forward error correction decoder 20 corrects and decodes the encoded symbols into information symbols corresponding to the input information symbols received by the communication system 10.

Figure 6:
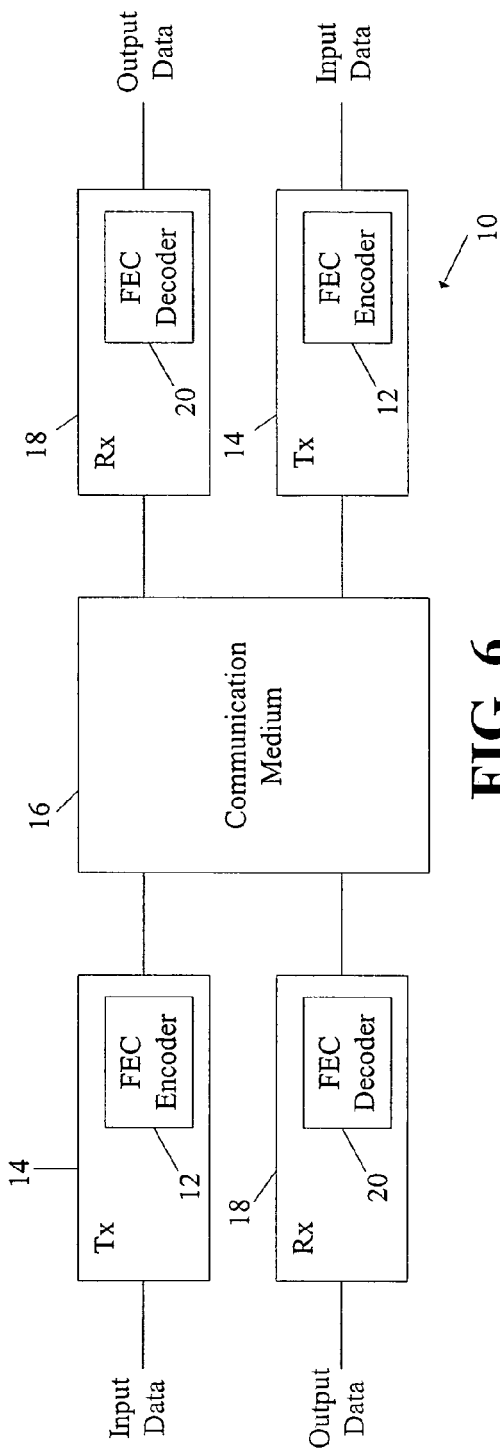

FIG. 6 illustrates another embodiment of the present invention. This embodiment is similar to that found in FIG. 5, but the forward error correction encoder 12 is now part of the transmitter 14. Also, the forward error correction decoder 20 is now part of the receiver 18.

The present invention may be implemented in a number of ways. For example, computer code written in either a low or high order language may be written to carry out the present invention. This computer code may be executed on general purpose or application specific computers or processors of any type or embedded computers and controllers of any type. The computer code may be stored on any type of media including, for example, hard or floppy magnetic disks, optical disks, magnetic tape, or solid state memory. The storage media may be part of the computer or may be separate and attached to the computer. The media may be read only or read/write capable. The invention may also be implemented in a programmable gate array or other signal processor. Also, the invention may be implemented in an integrated circuit, for example, an application specific integrated circuit or general purpose integrated circuit. The integrated circuit may be solely for forward error correction or could implement forward error correction along with other functions. Either an encoder or decoder according the present invention may be implemented using any of the above implementations. In addition, an encoder and decoder used in the same system may each be implemented differently, for example, the encoder may be an integrated circuit and the decoder may be a programmable signal processor.

Many variations and modifications may be made to the present invention without departing from its scope. For example, systematic as well as non-systematic component codes may be used in the irregular product code. Any combination of component codes in any order may be used to introduce the irregularity into the irregular array code. The irregularity may result in any pattern. Many other variations, modifications, and combinations are taught and suggested by the present invention, and it is intended that the foregoing specification and the following claims cover such variations, modifications, and combinations.

The invention claimed is:

1. A method for encoding information symbols comprising:
   loading information symbols into a data array with $n^{(1)}$ rows and $n^{(2)}$ columns, wherein each column has $k_i^{(1)}$ information symbols, and wherein $k^{(1)}$ is an array that has at least two different values;
   encoding each column with a code $C_i^{(1)}$ from a family of nested codes $C^{(1)}$, wherein $C^{(1)}$ includes two different nested codes; and
   encoding each row with a code $C^{(2)}$.

2. The method of claim 1, wherein the codes in the family of codes $C^{(1)}$ are selected from the group consisting of BCH codes, Reed-Solomon codes, and Reed-Muller codes.

3. A method for encoding data comprising:
   loading information symbols into an m-dimensional array, wherein m is a positive integer $\geq 2$, and wherein a first dimension has a vector of $k_i^{(1)}$ information symbols, where $k^{(1)}$ is an array that has at least two different values, and a second dimension has a vector of fixed number $k^{(2)}$ information symbols;
   encoding each vector of the first dimension with a code $C_i^{(1)}$ from a family of nested codes $C^{(1)}$, wherein $C^{(1)}$ includes two different nested codes; and
   encoding each vector of the second dimension with a code $C^{(2)}$.

4. The method of claim 3, wherein the codes in the family of codes $C^{(1)}$ are selected from the group consisting of BCH codes, Reed-Solomon codes, and Reed-Muller codes.

5. The method of claim 3, wherein the codes in the family of codes $C^{(1)}$ are BCH codes and Reed-Solomon codes.

6. Information stored in a data storage medium which, when executed by a processor, cause the processor to perform the steps of:
   loading information symbols into a data array with $n^{(1)}$ rows and $n^{(2)}$ columns, wherein each column has $k_i^{(1)}$ information symbols, and wherein $k^{(1)}$ is an array that has at least two different values;
   encoding each column with a code $C_i^{(1)}$ from a family of nested codes $C^{(1)}$, wherein $C^{(1)}$ includes two different nested codes; and
   encoding each row with a code $C^{(2)}$.

7. The information of claim 6, wherein the codes in the family of codes $C^{(1)}$ are selected from the group consisting of BCH codes, Reed-Solomon codes, and Reed-Muller codes.

8. The information of claim 6, wherein the codes in the family of codes $C^{(1)}$ are BCH codes and Reed-Solomon codes.

9. An information encoder comprising:
   a first input for receiving information symbols;
   a second input for receiving an irregular array code;
   a processor coupled to the first and second inputs that places the information symbols in a data array and that applies the irregular array code to produce encoded information symbols; and
   an output for outputting the encoded information symbols;
   wherein the irregular array code includes a first code family $C_1$ including nested codes $C_i^{(1)}$, wherein nested codes $C_i^{(1)}$ encode the columns of the data array, and wherein the first code family $C_1$ includes at least two different nested codes and a second code family $C_2$ including a single code $C^{(2)}$, wherein code $C^{(2)}$ encodes the rows of the data array.

10. The information encoder of claim 9, wherein the encoder is implemented on an integrated circuit.

11. The information encoder of claim 9, wherein the encoder is implemented on a general purpose computer.

12. The information encoder of claim 9, wherein the codes in the family of codes $C^{(1)}$ are selected from the group consisting of BCH codes, Reed-Solomon codes, and Reed-Muller codes.

13. The information encoder of claim 9, wherein the codes in the family of codes $C^{(1)}$ are BCH codes and Reed-Solomon codes.

14. A communication system comprising:
   a forward error correction encoder with an input receiving information symbols and an output producing encoded data, wherein the forward error correction encoder:
      loads information symbols into an array with $n^{(1)}$ rows and $n^{(2)}$ columns, wherein each column has $k_i^{(1)}$ information symbols, and wherein $k^{(1)}$ is an array that has at least two different values;
      encodes each column with a code $C_i^{(1)}$ from a family of nested codes $C^{(1)}$, wherein $C^{(1)}$ includes two different nested codes; and
      encodes each row with a code $C^{(2)}$;

a communication medium;

a transmitter with an input connected to the output of the forward error correction encoder and an output connected to the communication medium, wherein the transmitter transmits the encoded data through the communication medium;

a receiver with an input connected to the communication medium and an output, wherein the receiver receives the encoded data from the communication medium; and a forward error correction decoder with an input connected to the output of the receiver, wherein the decoder decodes the encoded data into information symbols.

15. The communication system of claim 14, wherein the forward error correction encoder is part of the transmitter.

16. The communication system of claim 14, wherein the forward error correction decoder is part of the receiver.

17. The communication system of claim 14 where in the communication medium is selected from the group consisting of an electrical medium, an optical medium, a storage medium, or a free space medium.

18. The communication system of claim 14, wherein the codes in the family of codes $C^{(1)}$ are selected from the group consisting of BCH codes, Reed-Solomon codes, and Reed-Muller codes.

19. The communication system of claim 14, wherein the codes in the family of codes $C^{(1)}$ are BCH codes and Reed-Solomon codes.

* * * * *

UNITED STATES PATENT AND TRADEMARK OFFICE
CERTIFICATE OF CORRECTION

PATENT NO. : 7,296,212 B1 Page 1 of 1
APPLICATION NO. : 10/714416
DATED : November 13, 2007
INVENTOR(S) : A. Roger Hammons, Jr.

It is certified that error appears in the above-identified patent and that said Letters Patent is hereby corrected as shown below:

Column 9, ln. 63, Claim 3, delete "$\geqq$" and insert -- $\geq$ --.

Column 10, ln. 2, Claim 3, delete "$C^{i\,(1)}$", and insert -- $C_i^{(1)}$ --.

Signed and Sealed this

Sixteenth Day of February, 2010

David J. Kappos
*Director of the United States Patent and Trademark Office*